United States Patent
Graf et al.

(10) Patent No.: US 8,008,729 B2
(45) Date of Patent: Aug. 30, 2011

(54) INTEGRATED CIRCUIT WITH A CONTACT STRUCTURE INCLUDING A PORTION ARRANGED IN A CAVITY OF A SEMICONDUCTOR STRUCTURE

(75) Inventors: Werner Graf, Dresden (DE); Clemens Fitz, Dresden (DE)

(73) Assignee: Qimonda AG, Munich (DE)

( * ) Notice: Subject to any disclaimer, the term of this patent is extended or adjusted under 35 U.S.C. 154(b) by 309 days.

(21) Appl. No.: 12/251,864

(22) Filed: Oct. 15, 2008

(65) Prior Publication Data
US 2010/0090285 A1 Apr. 15, 2010

(51) Int. Cl.
*H01L 23/522* (2006.01)
(52) U.S. Cl. .. 257/382; 257/520; 257/774; 257/E23.152
(58) Field of Classification Search .................... 257/514
See application file for complete search history.

(56) References Cited

U.S. PATENT DOCUMENTS

| 6,077,740 | A | 6/2000 | Jeng et al. | |
|---|---|---|---|---|
| 2001/0029100 | A1* | 10/2001 | Huang et al. | 438/638 |
| 2006/0255387 | A1* | 11/2006 | Dudek | 257/296 |
| 2009/0302380 | A1 | 12/2009 | Graf et al. | |

* cited by examiner

*Primary Examiner* — Stephen W Smoot
(74) *Attorney, Agent, or Firm* — Edell, Shapiro & Finnan, LLC (57) ABSTRACT

An integrated circuit includes a contact structure with a buried first and a protruding second portion. The buried first portion is arranged in a cavity formed in a semiconductor structure and is in direct contact with the semiconductor structure. The protruding second portion is arranged above the main surface of the semiconductor structure and in direct contact with a conductive structure that is spaced apart from or separated from the main surface of the semiconductor structure. An insulator structure is arranged below and in direct contact with the contact structure.

20 Claims, 8 Drawing Sheets

INTEGRATED CIRCUIT WITH A CONTACT STRUCTURE INCLUDING A PORTION ARRANGED IN A CAVITY OF A SEMICONDUCTOR STRUCTURE

BACKGROUND

Contact structures connect connection lines and electronic devices arranged in a plurality of wiring and device layers in integrated circuits. Typically, the source/drain regions of field effect transistors (FETs) are formed in a single crystalline semiconductor layer or substrate. The source/drain regions of a first FET may be electrically coupled via a low-resistance path with gate electrodes or source/drain regions of further FETs formed in the same device layer. The low-resistance path typically includes a connection line in a wiring layer and contacts, which connect the connection line with the source/drain region of the first FET and with a terminal of a further FET. The contacts are typically formed by depositing an interlayer dielectric on the device layer, etching contact openings in the interlayer dielectric and filling the contact openings with a conductive material to form the contact structures in the contact openings. An overetch of the contact openings into the single crystalline semiconductor layer or substrate may occur.

SUMMARY

An integrated circuit as described herein includes a contact structure with a buried first and a protruding second portion. The first portion is arranged in a cavity formed in a semiconductor structure and is in direct contact with the semiconductor structure. The second portion is arranged above a main surface of the semiconductor structure and is in direct contact with a conductive structure spaced apart from the main surface of the semiconductor structure. An insulator structure is arranged below and in direct contact with the contact structure.

A method as described herein refers to the manufacturing of an integrated circuit, wherein a cavity is formed in a semiconductor structure. The method includes forming an insulator structure at the bottom of the cavity. The method further comprises forming a contact structure above the insulator structure, wherein the contact structure includes a buried first portion within the cavity and a protruding second portion protruding from the cavity. In other words, the second portion of the contact structure is arranged in a vertical projection of the first portion of the contact structure with reference to the main surface.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated, as they become better understood by reference to the following detailed description. The elements of the drawings are not necessarily to scale relative to each other. Like reference numerals designate corresponding similar structures. Corresponding features of the embodiments may be combined with each other.

DETAILED DESCRIPTION

In the following details, embodiments of the integrated circuit and method are described in connection with the figures.

Figure 1:
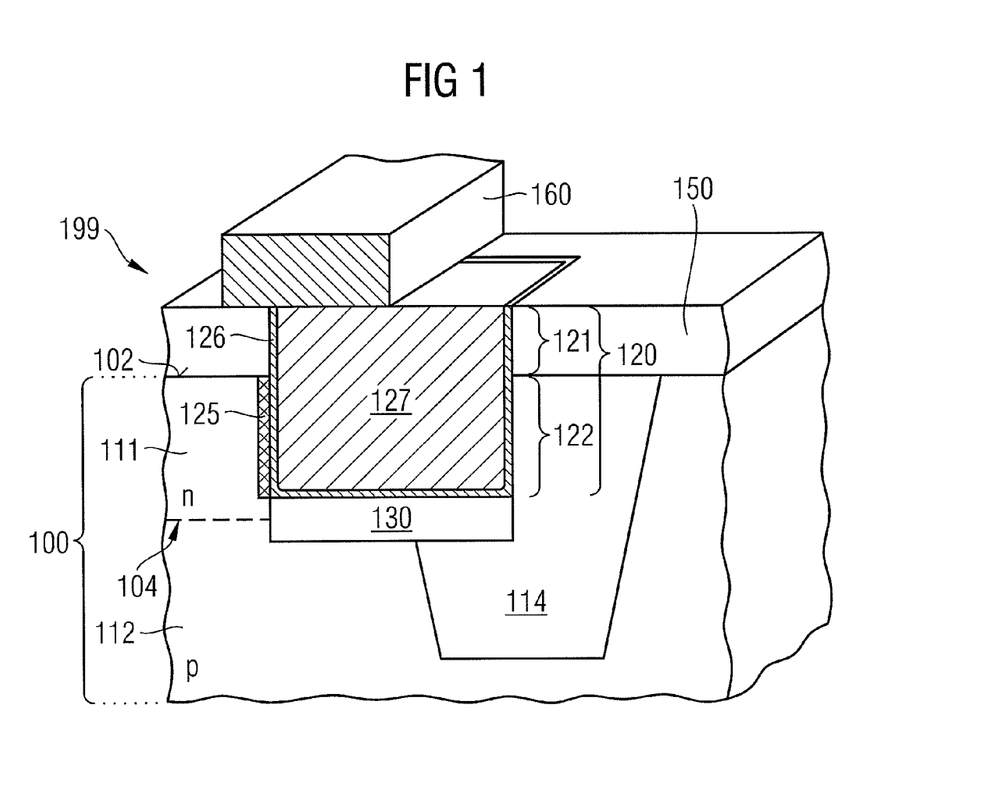
FIG. 1 illustrates a schematic perspective view of a portion of an integrated circuit with a contact structure electrically coupling a conductive structure and a doped semiconductor region and an insulator structure underlying the contact structure according to an embodiment of the invention.

FIG. 1 schematically illustrates a portion of an integrated circuit 199 including a semiconductor structure 100, which may be, by way of example, a singulated portion or die of a single crystalline silicon wafer, a SiGe-wafer, an A(III)-B(V)- wafer or a silicon-on-insulator (SoI)-wafer. The semiconductor structure 100 may include further epitaxial semiconductor layers as well as further doped and undoped portions, conductive structures, components, devices and insulating structures which have previously been fabricated (e.g., a shallow trench isolation structure 114 isolating active areas within the substrate portion 100).

The semiconductor structure 100 may have a main surface 102 at which the semiconductor structure 100 is exposed to the majority of patterning processes in course of a manufacturing method and may include a first region 111 adjoining the main surface 102 and a second region 112 forming a pn-junction 104 with the first region 111. At least a portion of the pn-junction 104 faces the main surface 102 on the opposite side of the first region 111.

The first region 111 is an impurity region of a first conductivity type and the second region an impurity region of a second conductivity type, which is different from the first conductivity type. For example, the first conductivity type may be an n-type containing, for example, arsenic or phosphorus. The second conductivity type may be an intrinsic type containing approximately no impurities or a p-type containing boron, for example. According to another example, the first conductivity type is the p-type and the second conductivity type may be the intrinsic one or the n-type.

A contact structure 120 is arranged in a cavity that may be etched into the semiconductor structure 100 from the main surface 102. The contact structure 120 may include a first portion 122 arranged in the cavity and a second portion 121 projecting or extending from the first portion 122 above the main surface 102 and being in direct contact with the first portion 122. In other words, the second portion 121 of the contact structure is arranged in a vertical projection of the first portion 122 of the contact structure with reference to the main surface. The first portion 122 is in direct contact with and directly coupled to the first region 111. The cavity may be a groove with a length which significantly exceeds its width. Optionally, the cavity may be a trench with a length equal to or substantially equal to its width. In a horizontal cross-section parallel to the main surface 102, the cross-sectional area of the contact structure 120 may have an arbitrary shape (e.g., a circle, an ellipse, a rectangle or a rectangle with rounded corners).

The contact structure 120 may further include a silicided portion 125 arranged between the first region 111 and a non-silicided portion of the contact structure 120. The silicided portion may be formed of a metal silicide, for example, a refractory metal silicide (e.g., cobalt silicide $CoSi_2$ or titanium silicide $TiSi_2$). The non-silicided portion of the contact structure 120 may include or consist of, for example, p-doped or n-doped polysilicon, a metal or a metal compound with high electric conductivity (e.g., tungsten W, Ag, Au, Al or Cu) and may comprise a layered structure with a diffusion barrier liner and/or an adhesion liner and/or a seed liner. For example, the contact structure 120 may include a seed liner 126 lining the cavity in which the contact structure 120 is arranged and a fill portion 127 filling the cavity to form the contact structure 120 in the rest. In accordance with an embodiment, the material of the seed liner 126 may be, for example, titanium nitride or tantalum nitride and the material of the fill portion 127 may be tungsten. The contact structure 120 is in direct contact with the first region 111 along a contact area, which is a portion of its lateral surface area. The contact area may extend along the complete perimeter of the contact structure 120 and may encompass completely the contact structure 120. In accordance with other embodiments, the contact structure 120 may intersect an insulating structure, for example the shallow trench isolation structure 114, such that the contact area does not completely encompass the contact structure 120.

An insulator structure 130 is arranged directly below and in the vertical projection of the contact structure 120, for example, between the contact structure 120 and the bottom of the cavity, in which the contact structure 120 is arranged. The insulator structure 130 may completely fill a bottom portion of the cavity below the contact structure 120 and may extend between a first edge located between the pn-junction 104 and the main surface 102 and a second edge, which may be situated approximately at the same distance to the main surface 102 as the pn-junction 104, at a greater distance or at a smaller distance. The insulator structure 130 may be arranged such that a distance between the insulator structure and the main surface is smaller than a distance between the pn-junction and the main surface. The insulator structure 130 may be arranged such that a portion of the pn-junction is formed in a vertical projection below the insulator structure with reference to the main surface.

With respect to the main surface 102, a horizontal cross-sectional area and shape of the insulator structure 130 may be approximately equal to that of the first portion 122 of the contact structure 120. The material of the insulator structure 130 is dielectric, for example, an undoped silicon oxide (e.g., silicon dioxide) or a silicon oxide resulting from the decomposition of tetraethyl orthosilane. The insulator structure 130 separates a lower edge of the contact structure 120 and the second region 112. In the case of an approximately circular contact structure 120 with a radius of less than 40 nm, a contact area along the lateral surface area is larger than a bottom area of the contact structure 120, if the contact structure 120 overlaps the first region 111 by at least 20 nm. As a consequence, providing the insulator structure 130 at the bottom of the cavity allows an increased overetch into the semiconductor structure 100.

In addition, an optional silicide formation along the contact area may be separated (i.e., spaced apart) from the pn-junction 104 allowing more silicide to be formed without opening a leakage current path to the second region 112. A thermal budget applied to the semiconductor structure 100 after a silicide formation results in the growth of silicide grains, which increases a leakage current at the pn-junction 104 which may be formed in a vertical projection below the contact structure 120 or which the contact structure 120 may partly intersect. Arranging the lower edge of the silicided portions 125 from the pn-junction 104 allows a higher thermal budget to be applied after the silicide formation.

In a horizontal cross-section parallel to the main surface 102, the shape of the contact structure 120 may be arbitrary, (e.g., a circle, an ellipse, a rectangle or a rectangle with rounded corners). The shape may be the same in the buried first and the protruding second portions. The horizontal cross-sectional area of the second portion 121 may be greater than or approximately equal to that of the non-silicided portions 126, 127 in the first portion 122. The lateral surface area of the contact structure 120 may be approximately vertical or may be oblique with reference to the main surface 102. The second portion 121 may be embedded in an interlayer dielectric 150 which may have a layered structure and which may include or consist of one or more dielectric materials, (e.g., silicon nitride, doped silicon oxide or undoped silicon oxide (e.g., borophosphosilicate glass BPSG)). A conductive structure 160, made of, for example, doped polysilicon or a metal or a layered structure including a metal or metal compound, may be formed in a wiring layer, which is separated (i.e., spaced apart) from the main surface 102 by the interlayer dielectric 150. The conductive structure 160 may be a portion of an electronic device (e.g., a capacitor, a resistor, a diode or a field effect transistor) formed in a second tier (e.g., a higher layer or a connection line). The conductive structure 160 is formed in and/or above a wiring layer arranged above and separated (i.e., spaced apart) from the main surface 102 and may bear on the contact structure 120 and the interlayer dielectric 150. The contact structure 120 is in direct contact with the conductive structure 160 and provides a low-resistance connection between the first region 111 and the conductive structure 160. For example, the conductive structure 160 may be a connection line connecting the first region 111 with a further electronic device formed in the semiconductor structure 100 via, for instance, a further contact structure.

Figure 2:
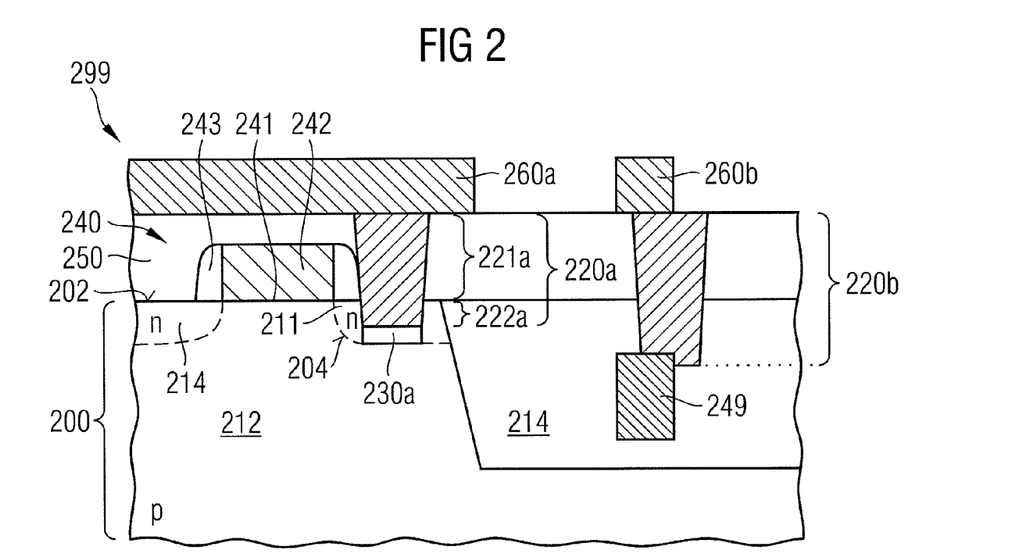
FIG. 2 is a simplified cross-sectional view of a portion of an integrated circuit with a first contact structure connecting a doped semiconductor region of an FET with a first connection line, and a second contact structure between a buried wiring line and a further connection line in accordance with another embodiment of the invention.

FIG. 2 refers to an integrated circuit 299 according to another embodiment. The integrated circuit 299 includes a field effect transistor (FET) 240 with a first and a second source/drain region 211, 214 of a first conductivity type formed in a well structure 212 of a second conductivity type, which may be the intrinsic type or the inverse first conductivity type. According to an embodiment, the first conductivity type is the n-type and the second conductivity type the p-type. In accordance with another embodiment, the first conductivity type is the p-type and the second conductivity type is the n-type. The field effect transistor 214 may further include a gate electrode 242, which may be formed above a main surface 202 of a semiconductor structure 200 in which the source/drain region 211, 214 and the well region 212 are formed. In accordance with other embodiments, the gate electrode 242 may be at least partly buried in the semiconductor structure 200 below the main surface 202. A gate dielectric 241 may be arranged between the gate electrode 242 and the semiconductor structure 200 such that a potential applied to the gate electrode 242 controls the charge carrier distribution between the first and the second source/drain regions 211, 214 capacitively. Sidewall spacers 243 may be formed along protruding portions of the gate electrode 242.

The integrated circuit 299 may further include a buried wiring line 249 embedded in an insulating structure 214 which is formed in the semiconductor structure 200 below the main surface 202. An interlayer dielectric 250 may be disposed above the transistor 240 and the main surface 202.

A first contact 220a provides a low electric resistance path between the first source/drain region 211 and a first connection line 260a formed in a wiring layer above the interlayer dielectric 250 and is in direct contact with the first connection line 260a. The second contact structure 220b may provide a low electric resistance path between the buried wiring line 249 and a second connection line 260b formed in the wiring layer. Both contact structures 220a, 220b may be formed by filling contact openings, wherein both contact openings may be formed in course of the same etch process. For example, the contact openings may be formed by applying and patterning a suitable hard mask material on the interlayer dielectric 250. Using the patterned hard mask as an etch mask, first the interlayer dielectric 250 is etched through and then the etch reaches the main surface 202. Subsequently, the shallow trench insulator structure 214, which may be made of silicon oxide, for example, is etched until the etch reaches the upper edge of the buried wiring line 249. Contemporaneously, the semiconductor structure 200 forming the lower edge for the contact opening of the first contact 220a may be overetched. Since the first and second source/drain regions 211, 214 may be relative shallow, the overetch into the semiconductor structure 200 may approach or even reach a pn-junction 204 between the first source/drain region 211 and the well region 212. The closer the lower edge of the contact structure 220a is situated to the pn-junction 204, the higher a leakage current to the well structure 212 may be.

An insulator structure 230a may be formed in the cavity resulting from the preceding contact etch into the semiconductor structure 200. The insulator structure 230a directly adjoins the first contact structure 220a, separates the first contact structure 220a from the pn-junction 204, and facilitates a contemporaneous etch of contact openings for the first and the second contact structures 220a, 220b in different materials below the main surface 202. Further, a silicide formation along an interface between the first region 211 and a buried contact portion 222a of the first contact structure 220a may be less critical. The first contact structure 220a includes a first portion 222a (i.e., buried contact portion) arranged in the cavity resulting from the contact opening etch in the semiconductor structure 200 and a second portion 221a above the main surface 202. The first portion 222a is in direct contact with the second portion 221a. In other words, the second portion 221a of the contact structure 220a is arranged in a vertical projection of the first portion 222a of the contact structure 220a with reference to the main surface 202.

In addition, the first portion 222a is in direct contact with the first source/drain region 211 along at least portions of a lateral surface area and may include a silicided portion arranged between the first source/drain region 211 and a non-silicided portion of the first contact structure 220a.

A horizontal cross-section of the second portion 221a parallel to the main surface 202 may be approximately equal to the cross-section of a non-silicided portion of the first portion 222a in view of shape and material. For example, the cross-sectional areas may approximately have the same shape and area size. The shape may be, for example, a circle, an ellipse, a rectangle or a rectangle with rounded corners. The horizontal cross-sectional area of the second portion 221a may be greater than or approximately the same as that of the non-silicided portions in the first portion 222a. The contact structures 220a, 220b may taper in direction of their bottom areas. The horizontal cross-sectional area of the second portion 221a may be equal to or greater than that of the first portion 222a. Both portions 221a, 222a may be solid conductive structures without any dielectric materials.

FIGS. 3A-3D refer to a method of manufacturing an integrated circuit with a contact structure comprising a first portion bearing on an insulator structure in accordance with an embodiment using an oxidation mask.

Figure 3A:
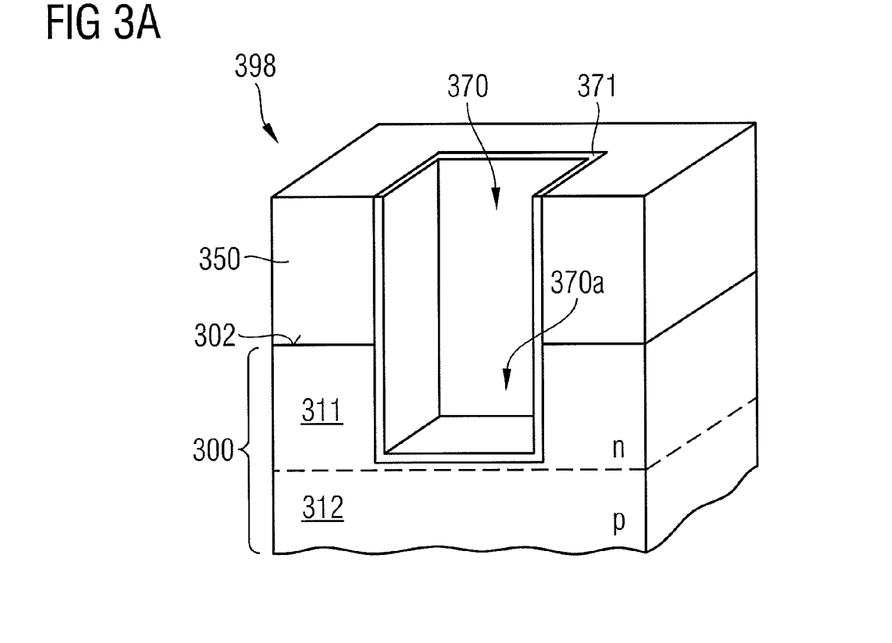
FIG. 3A illustrates a schematic perspective view of a substrate portion for illustrating a method of manufacturing an integrated circuit in accordance with an embodiment using an oxidation mask, after forming a mask liner lining a contact opening.

According to FIG. 3A, an interlayer dielectric 350 of a dielectric material (e.g., silicon nitride, doped silicon oxide or undoped silicon oxide (e.g., borophosphosilicate glass BPSG)), may be formed on a main surface 302 of a semiconductor structure 300 which includes a layered structure with a first region 311 of a first conductivity type formed above a second region 312 of a second conductivity type. The first region 311 may only be formed in a portion of the semiconductor structure 300. A contact opening 370 may be formed via lithography techniques which may include double patterning methods (e.g., pitch multiplication). The contact opening 370 penetrates the interlayer dielectric 350 and includes a cavity 370a in the semiconductor structure 300 below the main surface 302. A mask liner 371 may be deposited, which may at least line the contact opening 370 including the cavity 370a. The mask liner 371 may consist of or include a material having etch properties that may be altered by exposing the material to a radiation or particle beam. For example, the mask liner 371 may be a silicon nitride liner.

Figure 3B:
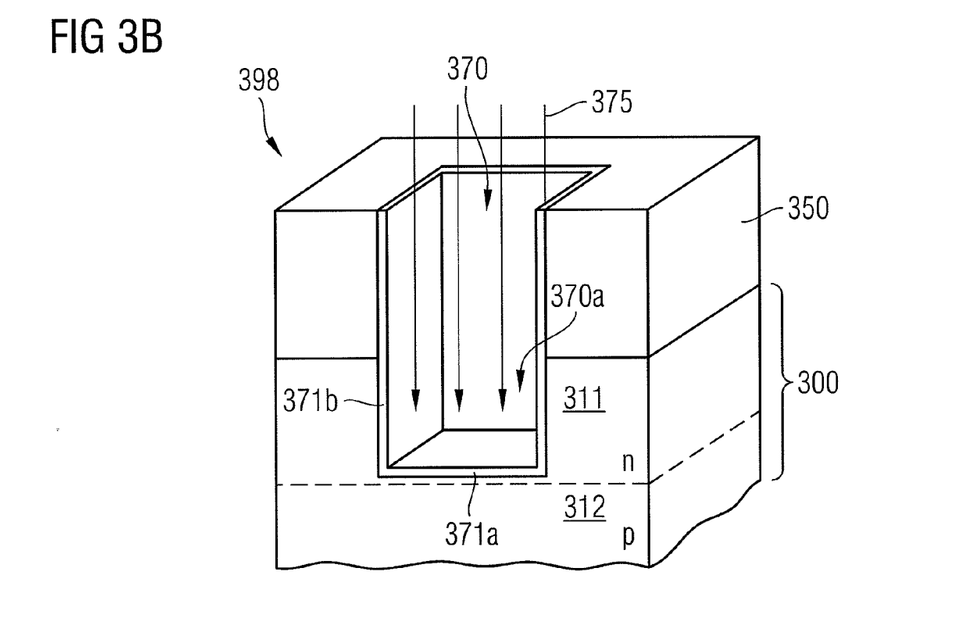
FIG. 3B illustrates a perspective view of the substrate portion of FIG. 3A after directing a radiation or particle beam to the bottom of the contact opening.

As illustrated in FIG. 3B, a suitable radiation or particle beam 375 is directed to the bottom of the cavity. In the case of a silicon nitride liner, for example, a xenon beam may be used to alter the etch properties in a first mask liner portion 371a at the bottom area of the cavity, whereas a second mask liner portion 371b formed on the sidewall remains substantially unaffected.

Figure 3C:
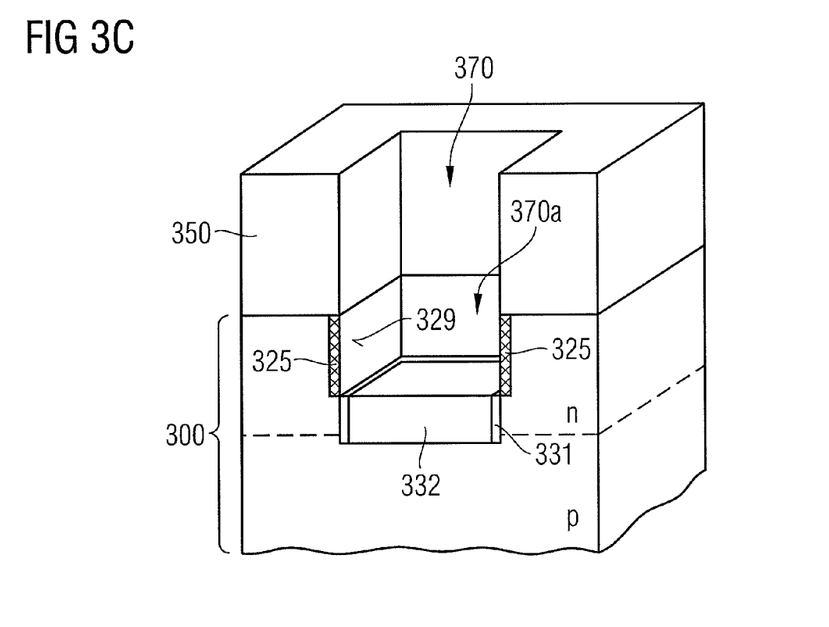
FIG. 3C illustrates a perspective view of the substrate portion of FIG. 3B after performing a masked oxidation process.

Referring to FIG. 3C, the first mask liner portion 371a of FIG. 3B may be removed. For example, an HF dip may be performed to remove a xenon-implanted portion of a silicon nitride liner. The remnant second mask liner portions may form an oxidation mask in course of a following oxidation of the semiconductor structure 300. For example, via a heating process in an oxygen containing ambient, an oxide structure 332 may be formed at the bottom area of the cavity 370a. Subsequently, uncovered portions of the second mask liner portion 371b of FIG. 3B may be removed. For example, $H_3PO_4$ may be used to strip uncovered portions of a silicon nitride liner to expose contact areas 329 along the sidewall of the cavity 370a above the oxide structure 332. Silicided portions 325 may be formed on the contact areas 329. For example, titanium may be deposited, for example, via a chemical vapor deposition (CVD) to form a titanium liner lining the cavity 370a. A heating process may be controlled to form a silicide where the titanium liner is in contact with the semiconductor structure 300. Un-reacted titanium may subsequently be removed.

Figure 3D:
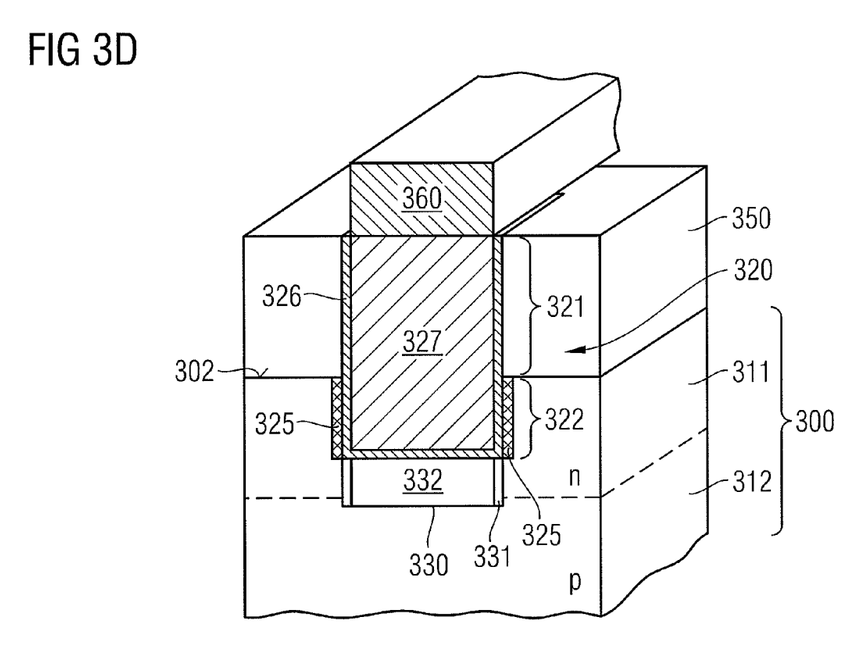
FIG. 3D illustrates a perspective view of the substrate portion of FIG. 3C after forming a contact structure and a connection line on the contact structure.

Referring to FIG. 3D a conductive diffusion barrier, adhesion or seed liner may be deposited which lines the contact opening 370 including in the cavity 370a in the semiconductor structure 300. For example, the material of a diffusion barrier liner 326 may, for example, be titanium nitride or tungsten nitride. Subsequently, a conductive fill material (e.g., tungsten or a material having a higher conductivity than tungsten (e.g., Ag, Al, and Au)) may be deposited in order to fill the contact opening 370 of FIG. 3C completely. Portions of the diffusion barrier liner 326 and the fill material 327 deposited outside the contact opening 370 of FIG. 3C may be removed, for example, via chemical mechanical polishing (CMP). The silicided portion 325, the diffusion barrier liner 326 and the fill portion 327 form a contact structure 320 with a first portion 322 below and a second portion 321 above the main surface 302. In other words, the second portion 321 of the contact structure 320 is arranged in a vertical projection of the first portion 322 of the contact structure 320 with reference to the main surface 302. The oxide structure 332 and remnant portions 331 of the mask liner form an insulator structure 330 which is formed in parts in the cavity 370a of FIG. 3A and in parts below the cavity 370a, since the oxidation process consumes a portion of the semiconductor material of the semiconductor structure 320. A contact area, which provides a low electric resistance path between the first region 311 and the contact structure 320, extends along the sidewalls of the cavity 370a above the insulator structure 330.

FIGS. 4A-4D refer to a method of manufacturing an integrated circuit with a contact structure comprising a first portion bearing on an insulator structure according to an embodiment using different oxidation rates.

Figure 4A:
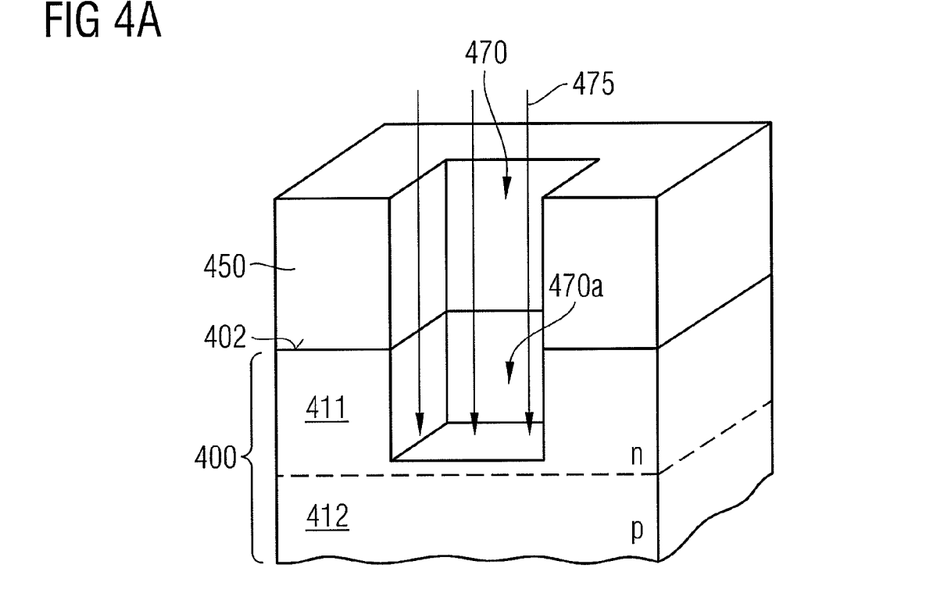
FIG. 4A illustrates a schematic perspective view of substrate portion for illustrating a method of manufacturing an integrated circuit in accordance with another embodiment using different oxidation rates, after directing a radiation or particle beam to the bottom of a contact opening.

According to FIG. 4A an interlayer dielectric 450 may be formed on a main surface 402 of a semiconductor structure 400. At least in a portion of the semiconductor structure 400, a first region 411 of a first conductivity type is formed along the main surface 402 and is arranged between the main surface 402 and a second region 412 of a second, different conductivity type. A contact opening 470 is formed, which cuts through the interlayer dielectric 450 and which includes a cavity portion 470a in the semiconductor structure 400 below the main surface 402. The cavity 470a may be a trench or a groove. A radiation or particle beam 475 may be directed to the bottom of the cavity 470a in order to change locally the oxidation properties. For example, a germanium ion implant may be performed to locally amorphize a single crystalline silicon.

Figure 4B:
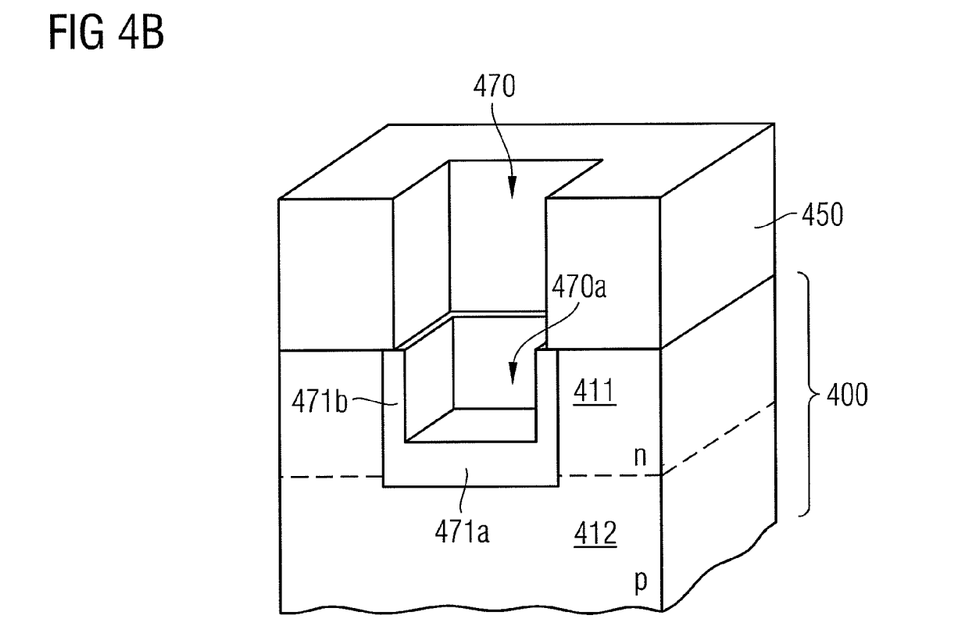
FIG. 4B illustrates a perspective view of the substrate portion of FIG. 4A after performing an oxidation process with different oxidation rates.

As illustrated in FIG. 4B, the semiconductor structure 400 may subsequently be subjected to a heating process in an oxygen containing ambient in order to grow oxide structures 471b, 471a on exposed portions of the semiconductor structure 400. On amorphized surfaces, the oxidation rate may be significantly greater than on un-amorphized surfaces. First oxide structures 471a having a first thickness are formed at the bottom of the cavity 470a and second oxide structures 471b having a second, smaller thickness may be formed at the sidewalls of the cavity 470a.

Figure 4C:
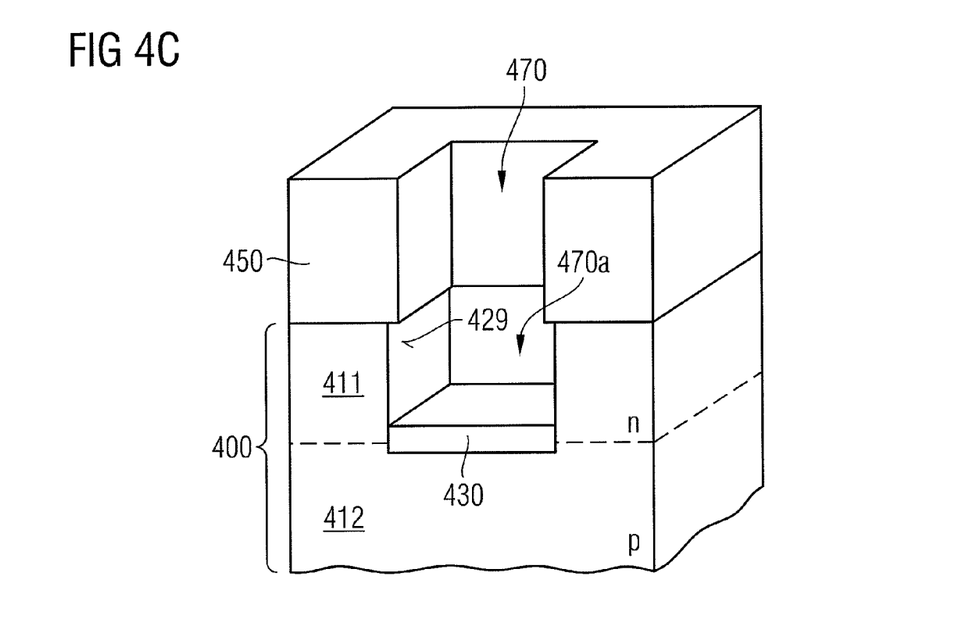
FIG. 4C illustrates a perspective view of the substrate portion of FIG. 4B after an isotropic oxide recess.

Referring to FIG. 4C, the oxide structures 471a, 471b may be isotropically recessed to completely remove the second oxide structures 471b from the sidewalls and to contemporaneously form an insulator structure 430 from recessed first oxide structures 471a of FIG. 4B. A contact area 429 of the first region 411 is exposed on the sidewall of the cavity 470a above the insulator structure 430.

Figure 4D:
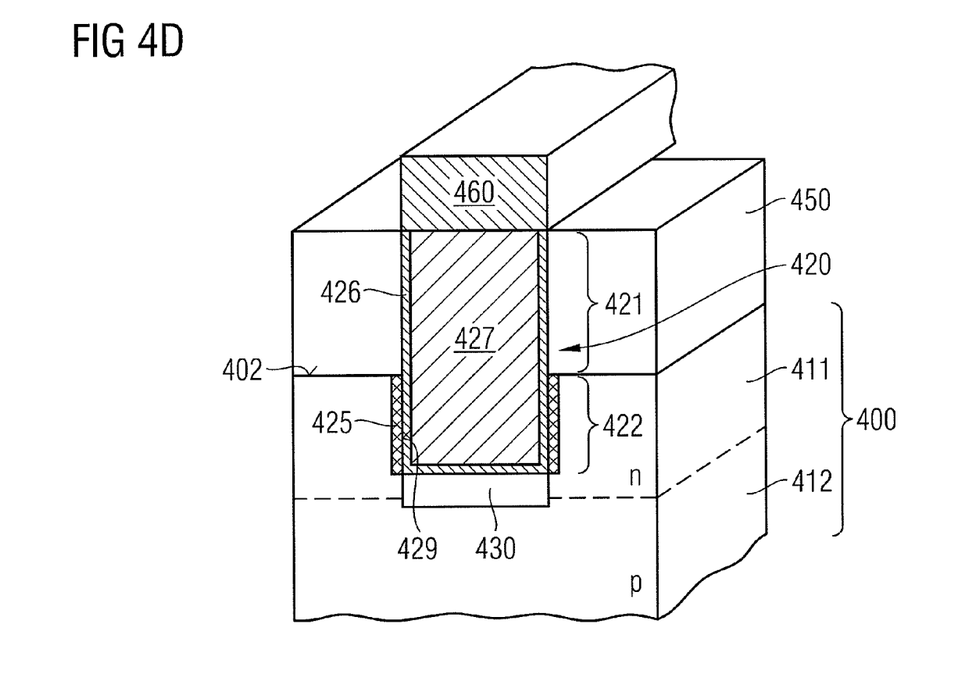
FIG. 4D illustrates a schematic perspective view of the substrate portion of FIG. 4C after forming a contact structure and a connection line above the contact structure.

As illustrated in FIG. 4D, a silicidation process may be performed to form silicided portions 425 along the contact area 429. Subsequently, a diffusion barrier liner 426 and a fill material 427 may be deposited and polished to form a contact structure 420 with a first portion 422 below the main surface 402 in the contact opening 470 of FIG. 4C and a second portion 421 above the main surface 402. In other words, the second portion 421 of the contact structure 420 is arranged in a vertical projection of the first portion 422 of the contact structure 420 with reference to the main surface 402. A connection line 460 may be formed above the contact structure 420.

Figure 5A:
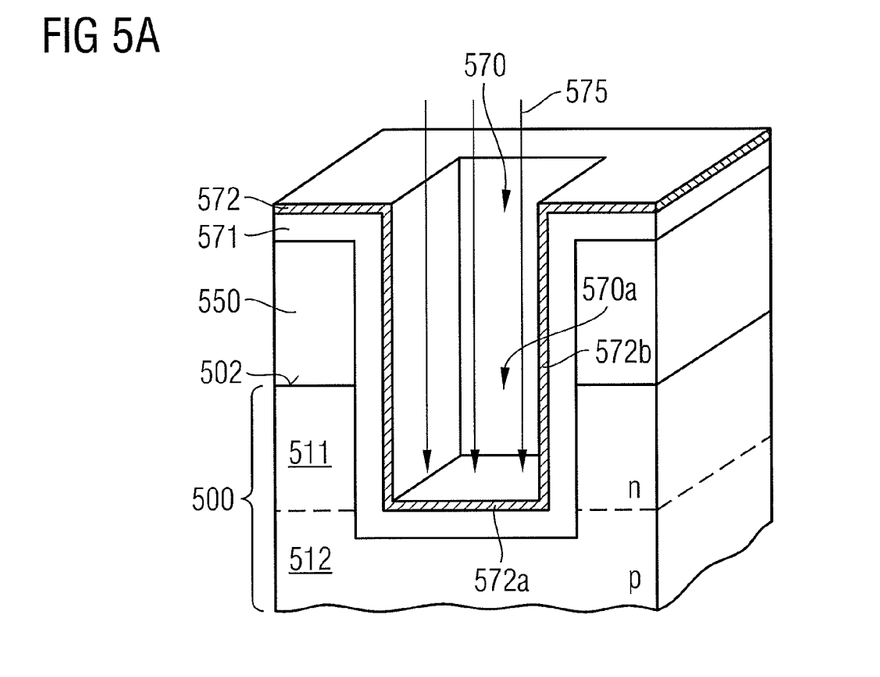
FIG. 5A illustrates a schematic perspective view of a substrate portion for illustrating a method of manufacturing an integrated circuit in accordance with an embodiment using an etch mask, after directing a radiation or particle beam to the bottom of a contact opening.
Figure 5B:
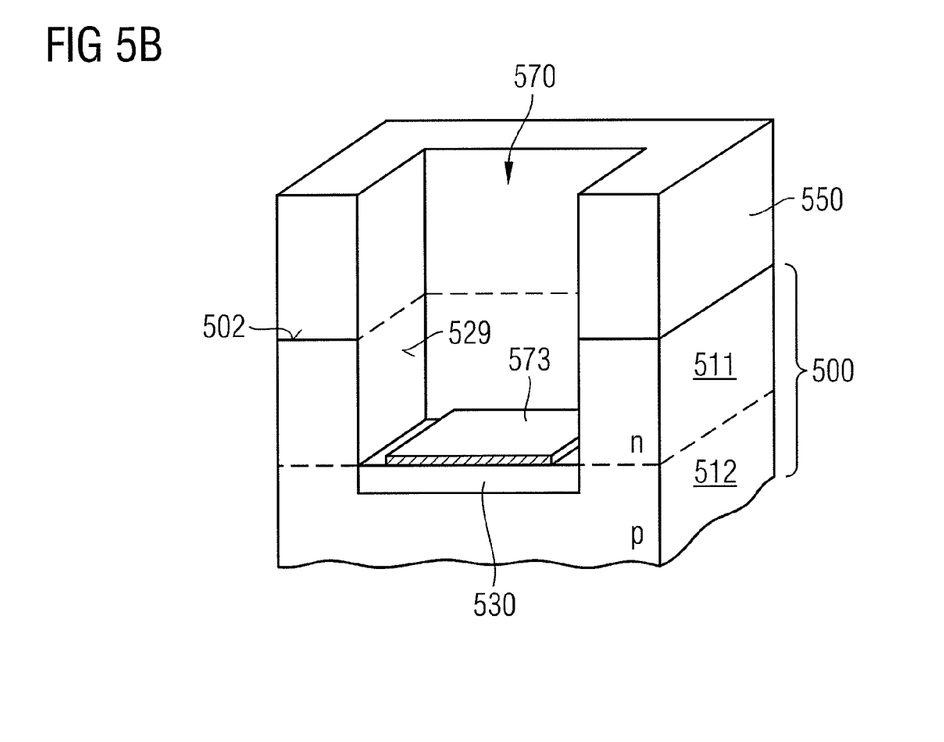
FIG. 5B illustrates a schematic perspective view of the substrate portion of FIG. 5A after performing a masked etch of an insulator material.
Figure 5C:
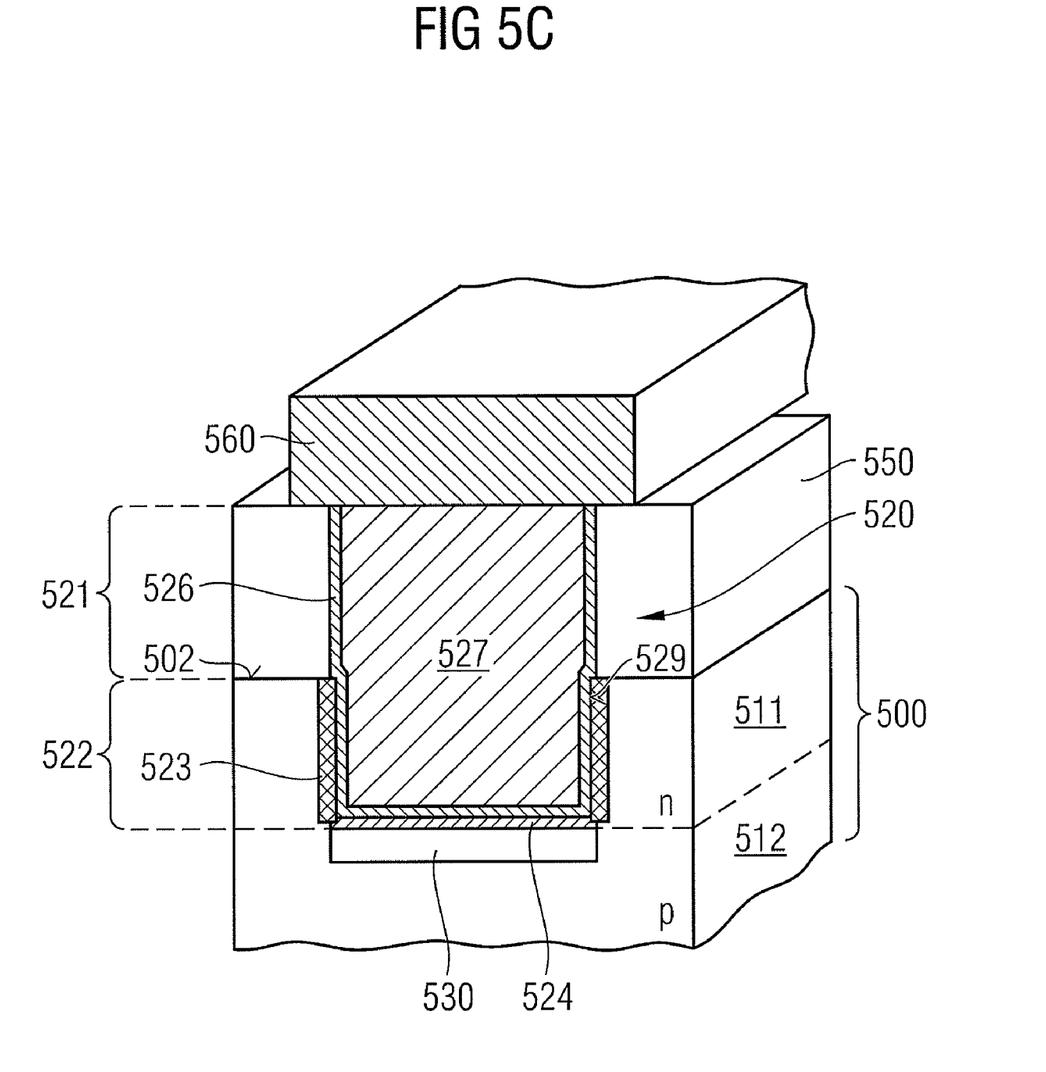
FIG. 5C illustrates a schematic perspective view of the substrate portion of FIG. 5B after forming a contact structure and a connection line above the contact structure.

FIGS. 5A-5C refer to a method of manufacturing an integrated circuit with a contact structure having a first portion bearing on an insulator structure according to an embodiment using an etch mask.

As illustrated in FIG. 5A, an interlayer dielectric 550 may be provided above a main surface 502 of a layered semiconductor structure 500. The layered semiconductor structure 500 includes a first region 511 of a first conductivity type adjoining to a portion of the main surface 502 and bearing on a second region 512 of a second conductivity type. A contact opening 570 is formed via lithography techniques which may include double patterning methods, wherein the contact opening 570 penetrates the interlayer dielectric 550 and includes a cavity 570a in the semiconductor structure 500 below the main surface 502. A dielectric liner 571 may be formed at least in the cavity 570a, for example, via oxidation of exposed portions of the semiconductor structure 500 or via deposition of a dielectric material (e.g., silicon oxide). A mask liner 572 comprising, for example, carbon, amorphous silicon or polysilicon, may be disposed on the dielectric liner 571, wherein a first mask liner portion 572a is formed at a bottom of the cavity 570a and a second mask liner portion 572b is formed along the sidewall of the cavity 570a. A radiation or particle beam 575 may be directed to either the first mask liner portion 572a or the second mask liner portion 572b to alter the etch properties of the respective mask liner portion 572a, 572b selectively to the other mask liner portion 572b, 572a. For example, a $BF_2$ ion implant may be performed to alter the etch properties of an amorphous silicon liner.

As illustrated in FIG. 5B, the second mask liner portion 572b of FIG. 5A may be removed selectively to the first mask liner portion 572a to form an etch mask 573. For example, a $BF_2$ implanted amorphous silicon liner may be annealed and non-implanted portions may be removed via a $NH_4OH$ etch.

The mask 573 covers a first portion of the dielectric liner 571 at the bottom of the cavity 570a, whereas a second portion of the dielectric liner 571 extending along the vertical sidewall of the contact opening 570 is uncovered. The second portion of the dielectric liner 571 is removed using the mask 573 as an etch mask to form an insulator structure 530 from the first portion of the dielectric liner 571. For example, an isotropic wet etch (e.g., HF deglaze) may be performed to remove uncovered portions of a silicon oxide liner and to uncover a contact area 529 extending above the insulator structure 530 and below the main surface 502 along the sidewall of the contact opening 570.

Referring to FIG. 5C, a siliciding process may be performed to form silicided portions 523 along the contact areas 529. A diffusion barrier liner 526, a fill portion 527 and a connection line 560 may be formed in accordance with previously described processes to form a contact structure 520 with a first portion 522 below and a second portion 521 above the main surface 502. In other words, the second portion 521 of the contact structure 520 is arranged in a vertical projection of the first portion 522 of the contact structure 520 with reference to the main surface 502.

Figure 6:
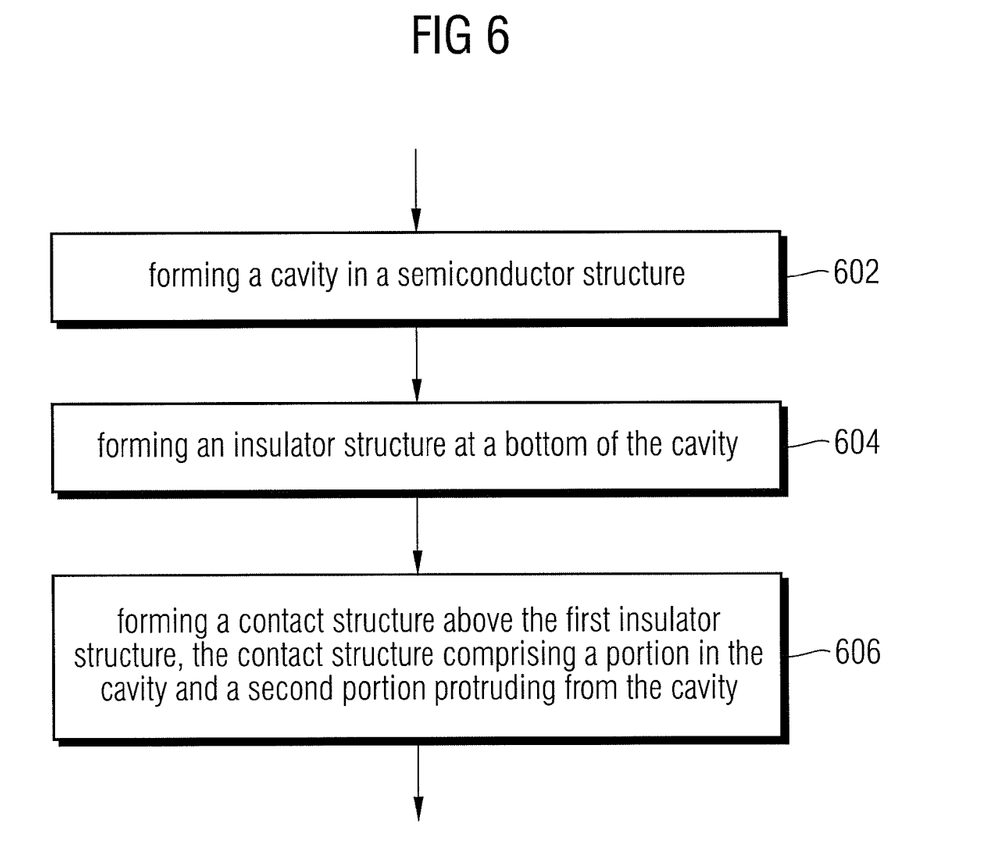
FIG. 6 is a simplified flow chart illustrating a method of manufacturing an integrated circuit in accordance with a further embodiment.

FIG. 6 is a simplified flow chart of a method of manufacturing an integrated circuit in accordance with a further embodiment. A cavity is formed in a layered semiconductor structure with a first region adjacent to a main surface and a second region underlying the first region (602). At the bottom of the cavity an insulator structure is formed (604). Above the insulator structure, a contact structure is formed in the cavity, wherein a buried first portion of the contact structure is formed below the main surface and a protruding second portion is formed above the main surface (606). The insulator structure separates the contact structure from a pn-junction between the first and the second region allowing a deeper overetch into the first region in course of a contact opening etch and the formation of silicided portions along the contact area between the contact structure and the first region, wherein the contact area is formed at the perimeter of the contact structure.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. An integrated circuit, comprising:
a contact structure comprising a first and a second portion, wherein the first portion of the contact structure is arranged in a cavity formed in a main surface of a semiconductor structure and is in direct contact with the semiconductor structure and wherein the second portion of the contact structure is arranged above the main surface and is in direct contact with a conductive structure separated from the main surface; and
an insulator structure arranged below and in direct contact with the contact structure and is arranged between a bottom of the contact structure and a portion of the semiconductor structure lying below the bottom of the contact structure.

2. An integrated circuit, comprising:
a contact structure comprising a first and a second portion, wherein the first portion of the contact structure is arranged in a cavity formed in a main surface of a semiconductor structure and is in direct contact with the semiconductor structure and wherein the second portion of the contact structure is arranged above the main surface and is in direct contact with a conductive structure separated from the main surface; and
an insulator structure arranged below and in direct contact with the contact structure, wherein:
the semiconductor structure comprises a first region of a first conductivity type adjacent to the main surface and a second region of a second conductivity type forming a pn-junction with the first region opposite the main surface; and
the contact structure is in direct contact with the first region.

3. The integrated circuit of claim 2, wherein a distance between the insulator structure and the main surface is smaller than a distance between the pn-junction and the main surface.

4. The integrated circuit of claim 2, wherein a portion of the pn-junction is formed in a vertical projection below the insulator structure with reference to the main surface.

5. The integrated circuit of claim 2, wherein a portion of a lateral surface area of the first contact portion is in direct contact with the first region of the semiconductor structure.

6. The integrated circuit of claim 2, wherein along a complete perimeter of the first portion of the contact structure is in direct contact with the first region of the semiconductor structure.

7. The integrated circuit of claim 2, wherein the first portion of the contact structure comprises a silicided portion that is in contact with the first region of the semiconductor structure.

8. The integrated circuit of claim 2, wherein the insulator structure completely fills a bottom portion of the cavity below the contact structure.

9. The integrated circuit of claim 2, wherein the second portion of the contact structure is arranged in a vertical projection of the first portion of the contact structure with reference to the main surface.

10. The integrated circuit of claim 2, wherein the first portion of the contact structure comprises a metal.

11. The integrated circuit of claim 2, wherein the conductive structure comprises a connection line arranged in a wiring layer extending parallel to the main surface, the connection line being in direct contact with the second portion of the contact structure.

12. An integrated circuit, comprising:
a contact structure comprising a first and a second portion, wherein the first portion of the contact structure is arranged in a cavity formed in a main surface of a semiconductor structure and is in direct contact with the semiconductor structure and wherein the second portion of the contact structure is arranged above the main surface and is in direct contact with a conductive structure separated from the main surface; and
an insulator structure arranged below and in direct contact with the contact structure, wherein a cross-section of the second portion of the contact structure parallel to the main surface corresponds in both shape and material to a cross-section of the first portion of the contact structure parallel to the main surface.

13. An integrated circuit, comprising:
a field effect transistor comprising a source/drain region adjacent a main surface of a semiconductor structure, the source/drain region being of a first conductivity type and being embedded in a well structure of a second conductivity type such that a pn-junction is formed between the source/drain region and the well structure;

a contact structure comprising:
- a first portion arranged in a cavity in the semiconductor structure and in direct contact with the source/drain region; and
- a second portion arranged above the main surface of the semiconductor structure and in direct contact with a conductive structure, the conductive structure being separated from the main surface; and an insulator structure arranged below and in direct contact with the contact structure.

14. The integrated circuit of claim 13, wherein the insulator structure completely fills a bottom portion of the cavity below the contact structure.

15. The integrated circuit of claim 13, wherein a distance between the insulator structure and the main surface of the semiconductor structure is smaller than a distance between the pn-junction and the main surface of the semiconductor structure.

16. The integrated circuit of claim 13, wherein a portion of a lateral surface area of the first contact portion is in direct contact with the source/drain region.

17. The integrated circuit of claim 13, wherein the first portion of the contact structure comprises a non-silicided portion and a silicided portion being arranged between the source/drain region and the non-silicided portion.

18. The integrated circuit of claim 13, wherein a cross-section of the second portion of the contact structure parallel to the main surface corresponds in both shape and material to a cross-section of the first portion of the contact structure parallel to the main surface.

19. The integrated circuit of claim 13, wherein the conductive structure comprises a connection line arranged in a wiring plane extending parallel to the main surface, the connection line being in direct contact with the second portion of the contact structure.

20. An integrated circuit, comprising:
- a semiconductor structure including a cavity disposed in a main surface thereof;
- a contact structure arranged in the cavity and in contact with the semiconductor structure, wherein the contact structure comprises a metal and a portion of the contact structure protrudes from the semiconductor structure; and
- an insulator structure disposed in a bottom portion of the cavity and between the semiconductor structure and the contact structure, the insulator structure being in direct contact with the contact structure and completely filling the bottom portion of the cavity below the contact structure such that a horizontal cross-sectional area and shape of the insulator structure is approximately equal to that of an adjacent portion of the contact structure.

* * * * *